US008823456B2

(12) United States Patent
Signoff et al.

(10) Patent No.: US 8,823,456 B2
(45) Date of Patent: *Sep. 2, 2014

(54) CANCELLATION OF GAIN CHANGE DUE TO AMPLIFIER SELF-HEATING

(71) Applicant: Marvell World Trade Ltd., St. Michael (BB)

(72) Inventors: David M. Signoff, Santa Clara, CA (US); Wayne A. Loeb, Belmont, CA (US); Ming He, Fremont, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 13/893,867

(22) Filed: May 14, 2013

(65) Prior Publication Data

US 2013/0249636 A1    Sep. 26, 2013

Related U.S. Application Data

(63) Continuation of application No. 13/306,289, filed on Nov. 29, 2011, now Pat. No. 8,441,320.

(60) Provisional application No. 61/422,522, filed on Dec. 13, 2010.

(51) Int. Cl.
    *H03F 3/04*    (2006.01)
    *H03F 1/30*    (2006.01)
    *H03G 3/30*    (2006.01)

(52) U.S. Cl.
    CPC ............ *H03F 1/30* (2013.01); *H03F 2200/468* (2013.01); *H03G 3/3042* (2013.01); *H03F 2200/447* (2013.01)

USPC .......................... 330/289; 330/310; 330/296

(58) Field of Classification Search
    USPC ........... 330/289, 285, 296, 310, 98, 133, 150, 330/256, 266, 272
    See application file for complete search history.

(56) References Cited

U.S. PATENT DOCUMENTS

| 7,375,588 | B2 | 5/2008 | Yamakawa et al. |
| 7,423,488 | B2 * | 9/2008 | Hunter et al. ................. 330/289 |
| 2006/0030359 | A1 | 2/2006 | Behzad et al. |
| 2010/0301945 | A1 | 12/2010 | Wan |

OTHER PUBLICATIONS

International Search Report and Written Opinion of the International Searching Authority for corresponding International Application No. PCT/US2011/063353, issued Feb. 6, 2012; 9 Pages.

\* cited by examiner

*Primary Examiner* — Hieu Nguyen

(57) ABSTRACT

A system including a power amplifier having a first gain, a preamplifier having a second gain, a first temperature sensor configured to sense the temperature of the power amplifier, and a bias generator. The first gain is a function of a temperature of the power amplifier. The preamplifier receives an input signal, amplifies the input signal according to the second gain, and outputs an amplified signal to the power amplifier. The bias generator generates a biasing signal to bias the preamplifier and adjusts the second gain of the preamplifier by adjusting the biasing signal based on the temperature of the power amplifier and an ambient temperature. The adjusted second gain of the preamplifier compensates a change in the first gain of the power amplifier due to a change in the temperature of the power amplifier.

13 Claims, 4 Drawing Sheets

CANCELLATION OF GAIN CHANGE DUE TO AMPLIFIER SELF-HEATING

CROSS-REFERENCE TO RELATED APPLICATIONS

This is a continuation of U.S. patent application Ser. No. 13/306,289 (now U.S. Pat. No. 8,441,320), filed on Nov. 29, 2011, which claims the benefit of U.S. Provisional Application No. 61/422,522, filed on Dec. 13, 2010. The entire disclosures of the above applications are incorporated herein by reference.

FIELD

The present disclosure relates generally to power amplifiers and more particularly to cancellation of gain change due to amplifier self-heating.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Power amplifiers are used in many applications. For example, power amplifiers are used in output stages of transmitters of communication devices. Power amplifiers are also used in receivers, voltage regulators, driver circuits that drive motors, and so on. Power amplifiers are often included in integrated circuits. To save power consumed by the integrated circuits, power amplifiers are typically turned on and off as required. For example, in a transmitter, a power amplifier is turned on when the transmitter transmits data and is turned off when the transmitter does not transmit data. As the power amplifier is turned on and off, the local power dissipation in the area surrounding the power amplifier changes significantly. Over time, in a die that includes the power amplifier, points farther away from the power amplifier reach an average temperature. Locally, in an area proximate to the power amplifier, however, there is a thermal transient every time the power amplifier is turned on and off.

The gain of the power amplifier is sensitive to temperature variations. The gain typically decreases as temperature increases. The gain can therefore drift over time due to self-heating of the power amplifier. The gain variation due to self-heating of the power amplifier can cause problems. For example, in some systems, transmit power is set at the beginning of a transmission and is not adjusted during the transmission. The gain of the power amplifier and therefore the transmit power of the power amplifier may change due to self-heating of the power amplifier during the transmission. The gain change may cause errors in transmit signals transmitted by the transmitter. Small changes in the gain of the power amplifier translate into large error vector magnitude (EVM). It is therefore desirable to reduce the size of the gain change of the power amplifier due to thermal transients.

SUMMARY

A system includes a power amplifier, a preamplifier, a first temperature sensor, and a bias generator. The power amplifier has a first gain, which is a function of a temperature of the power amplifier. The preamplifier has a second gain and is configured to receive an input signal, amplify the input signal according to the second gain of the preamplifier, and output an amplified signal to the power amplifier. The first temperature sensor is configured to sense the temperature of the power amplifier and generate a first signal in accordance with the temperature of the power amplifier. The bias generator is configured to: generate a first biasing signal to bias the power amplifier, wherein the first gain of the power amplifier is based on the first biasing signal; generate a second biasing signal to bias the preamplifier, where the second gain of the preamplifier is based on the second biasing signal; and adjust the second gain of the preamplifier by adjusting the second biasing signal based on the first signal generated by the first temperature sensor in response to sensing a change in the temperature of the power amplifier. The adjusted second gain of the preamplifier compensates a change in the first gain of the power amplifier due to the change in the temperature of the power amplifier.

In other features, the temperature sensor is located at a first distance from the power amplifier, and the system further includes a second temperature sensor arranged at a second distance from the power amplifier, where the second distance is greater than the first distance. The second temperature sensor is configured to sense an ambient temperature and to generate a second signal in accordance with the ambient temperature. The bias generator is configured to adjust the second gain of the preamplifier by adjusting the second biasing signal based on the first signal generated by the first temperature sensor in response to sensing a change in the temperature of the power amplifier and the second signal generated by the second temperature sensor in response to sensing a change in the ambient temperature.

In still other features, a method includes sensing a temperature of a power amplifier using a first temperature sensor and generating a first signal in accordance with the temperature. The power amplifier (i) has a first gain and (ii) receives, as input, an output of a preamplifier having a second gain. The method further includes generating a first biasing signal, where the first gain of the power amplifier is based on the first biasing signal; generating a second biasing signal, where the second gain of the preamplifier is based on the second biasing signal; and adjusting the second gain of the preamplifier by adjusting the second biasing signal based on the first signal.

In other features, the method further includes compensating a change in the first gain of the power amplifier due to a change in the temperature of the power amplifier by adjusting the second gain of the preamplifier.

In other features, the method further includes arranging the first temperature sensor at a first distance from the power amplifier, and arranging a second temperature sensor at a second distance from the power amplifier, where the second distance is greater than the first distance. The method further includes sensing an ambient temperature using the second temperature sensor and generating a second signal in accordance with the ambient temperature.

In other features, the method further includes adjusting the second gain of the preamplifier by adjusting the second biasing signal based on (i) the first signal and (ii) the second signal.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

The present disclosure proposes systems and methods for canceling changes in gain of a power amplifier caused by self-heating of the power amplifier. For example, a temperature sensor can be installed adjacent to the power amplifier to sense temperature variations proximate to the power amplifier. The temperature sensor generates a signal indicating the temperature variations. The signal can be used to adjust a gain of the power amplifier or of a preamplifier stage that drives the power amplifier. For example, the signal can be used to adjust a bias current of the power amplifier or the preamplifier. Adjusting the gain of the power amplifier can impact the linearity of the power amplifier. Adjusting the gain of the preamplifier is less likely to impact the linearity of the power amplifier and is therefore more desirable.

The temperature sensor installed adjacent to the power amplifier can be sensitive to both the transient changes in the temperature of the power amplifier and changes in static/ambient temperature. The signal generated by the temperature sensor will therefore adjust the gain of the power amplifier or the preamplifier based on the transient changes in the temperature of the power amplifier as well as changes in static/ambient temperature. This can reduce the temperature coefficient of the transmitter gain, which can be desirable. When the ambient temperature range is large (e.g., −40 C to 125 C), however, the adjusted bias current may decrease or increase to a level that may degrade the linearity of the transmitter. Therefore, another temperature sensor can be installed farther away from the power amplifier, and the difference between the signals generated by the two temperature sensors can be used to adjust the gain.

Figure 1:
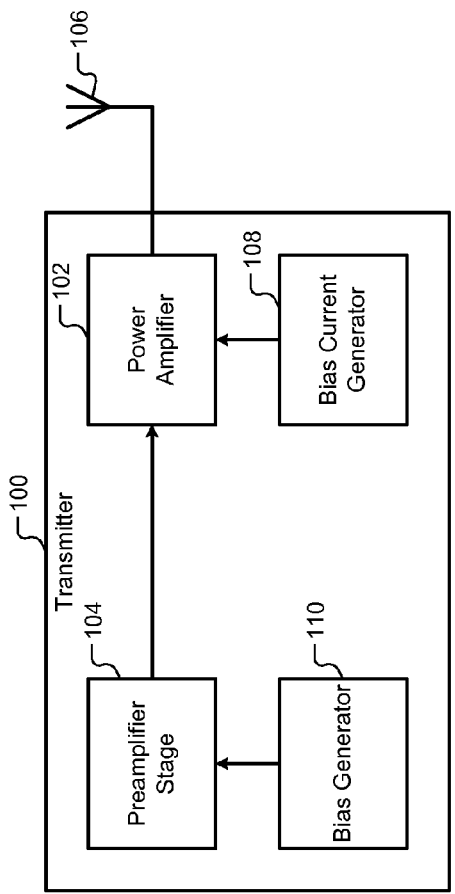
FIG. 1 is a functional block diagram of a transmitter.

Referring now to FIG. 1, a transmitter 100 including a power amplifier 102 and a preamplifier stage 104 is shown. Throughout the present disclosure, transmitters are used as example only. The teachings of the present disclosure can be applied to any other system that uses a power amplifier and a preamplifier stage. Further, throughout the present disclosure, a single preamplifier stage is shown for example only. Some systems may include a plurality of preamplifier stages. In these systems, the teachings described herein with respect to the preamplifier stage can be applied to any of the plurality of preamplifier stages.

The transmitter 100 includes a bias generator 108 that generates a bias current to bias the power amplifier 102 and a bias generator 110 that generates a bias current to bias the preamplifier stage 104. Independent bias generators for the power amplifier 102 and the preamplifier stage 104 are shown for example only. Instead, a single bias generator may be used to generate bias for both the power amplifier 102 and the preamplifier stage 104. Biasing determines operating parameters (e.g., gain, linearity, and so on) of the power amplifier and the preamplifier stage. Throughout the present disclosure, bias currents are used to bias the power amplifier and the preamplifier stage for example only. Other type of biasing (e.g., voltage-based biasing) may be used instead in other systems.

A signal to be transmitted is input to the preamplifier stage 104. The preamplifier stage 104 amplifies the signal according to the gain of the preamplifier stage 104. An amplified signal output by the preamplifier stage 104 is input to the power amplifier 102, which further amplifies the amplified signal according to the gain of the power amplifier 102. An output signal generated by the power amplifier 102 is transmitted via an antenna 106.

Figure 2:
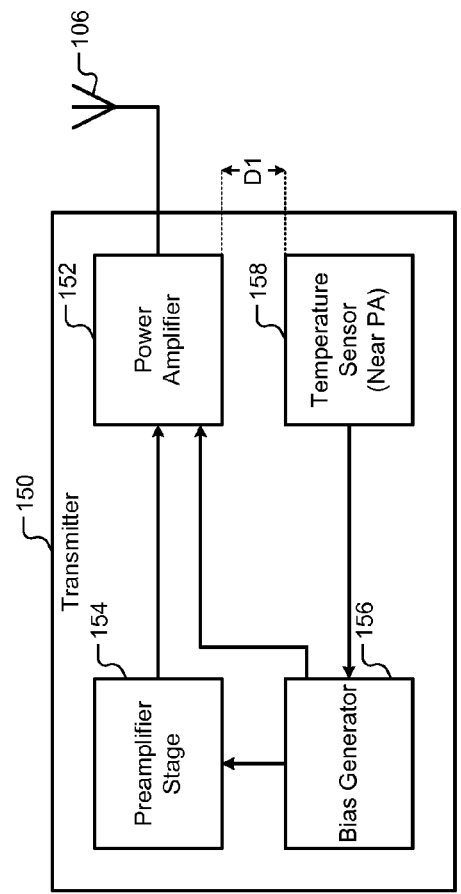
FIG. 2 is a functional block diagram of a system for canceling gain changes due to self-heating of a power amplifier using a temperature sensor located near the power amplifier.

Referring now to FIG. 2, a transmitter 150 includes a power amplifier 152, a preamplifier stage 154, and a bias generator 156 arranged on a die of an integrated circuit. The bias generator 156 biases the power amplifier 152 and the preamplifier stage 154. A temperature sensor 158 is arranged adjacent to the power amplifier 152 at a distance D1 from the power amplifier 152 on the die. The temperature sensor 158 senses changes in temperature of the power amplifier 152 and/or its surrounding area and generates a signal (e.g., current) based on the temperature of the power amplifier 152. The bias generator 156 uses the current as a reference for generating a bias current for the preamplifier stage 154. The bias generator 156 generates a bias current for the power amplifier 152 that is preset according to desired linearity. The bias generator 156 does not adjust the bias current of the power amplifier based on the current output by the temperature sensor 158.

The gain of the power amplifier 152 varies inversely with the temperature of the power amplifier 152. As the temperature of the power amplifier 152 increases, the gain of the power amplifier 152 decreases from a normal value determined by the bias current of the power amplifier 152. As the temperature of the power amplifier 152 increases, the current output by the temperature sensor 158 increases. Based on the increased current output by the temperature sensor 158, the bias generator 156 increases the bias current of the preamplifier stage 154, which in turn increases the gain of the preamplifier stage 154 from its normal value. For example, the normal value of the gain of the preamplifier stage 154 is determined by a base bias current generated for the preamplifier stage 154 by the bias generator 156 and a steady-state current output by the temperature sensor 158.

The increase in the gain of the preamplifier stage 154 compensates for the decrease in the gain of the power amplifier 152 caused by the increase in the temperature of the power amplifier 152. Thus, the overall gain of the transmitter 150 (e.g., a product of the gains of the power amplifier 152 and the preamplifier stage 154) is maintained irrespective of the increase in the temperature of the power amplifier 152. The overall gain of the transmitter 150 is maintained at a value determined by the normal values of the gains of the preamplifier stage 154 and the power amplifier 152.

Figure 3A:
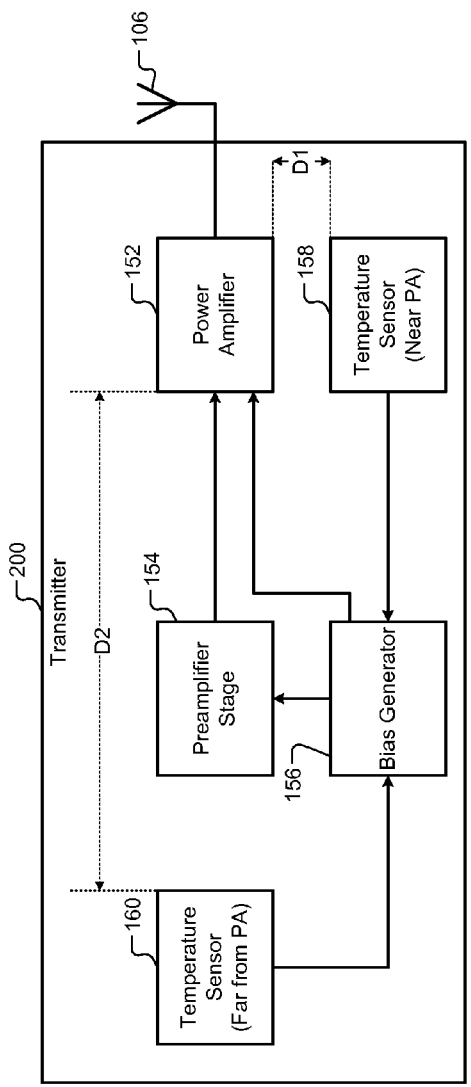
FIGS. 3A and 3B are functional block diagrams of a system for canceling gain changes due to self-heating of a power amplifier using two temperature sensors, one located near and another located far from the power amplifier.
Figure 3B:
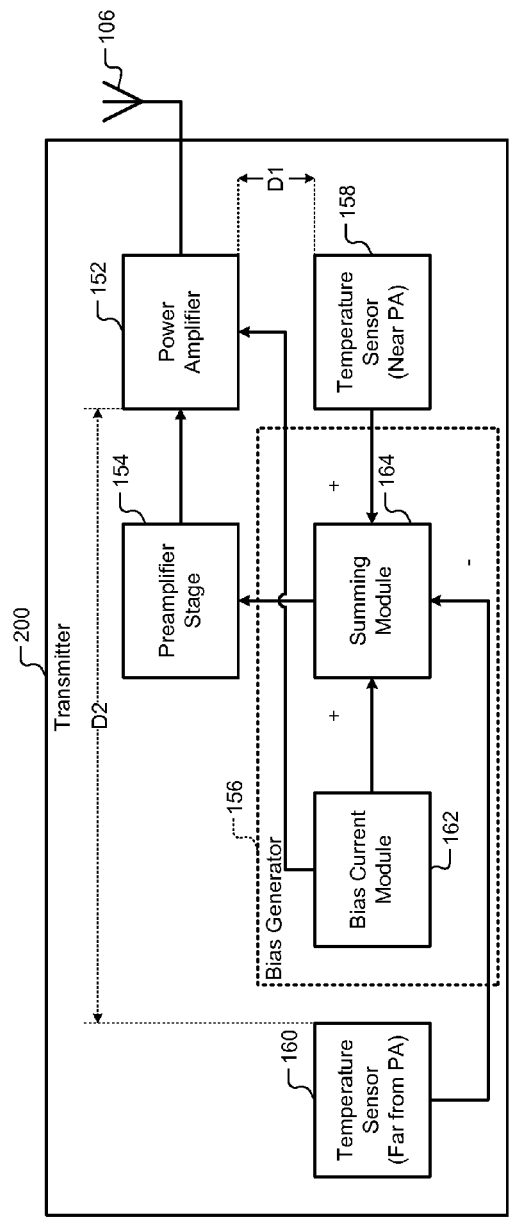

Referring now to FIGS. 3A and 3B, a transmitter 200 including an additional temperature sensor is shown. In FIG. 3A, the transmitter 200 includes all of the components of the transmitter 150 and further includes an additional temperature sensor 160 arranged at a distance D2 from the power amplifier 152 on a die of an integrated circuit. The distance D2 of the temperature sensor 160 from the power amplifier 152 is greater than the distance D1 of the temperature sensor 158 from the power amplifier 152. The temperature sensor 160 senses changes in ambient temperature and generates a signal (e.g., current) based on changes in the ambient temperature. The temperature sensor 160 does not sense transient temperature changes near the power amplifier 152 since the distance on the die acts as a filter for thermal transients.

In FIG. 3B, an example of the bias generator 156 is shown. The bias generator 156 includes a bias current module 162 and a summing module 164. The bias current module 162 generates a predetermined bias current for the power amplifier 152. The bias current module 162 also generates a predetermined bias current for the preamplifier stage 154. The summing module 164 adds the current output by the temperature sensor 158 to the predetermined bias current of the preamplifier stage 154. The summing module 164 subtracts the current output by the temperature sensor 160 from the predetermined bias current of the preamplifier stage 154. Accordingly, the bias generator 156 provides the predetermined bias current to the preamplifier stage 154 when the currents output by the temperature sensors 158 and 160 are equal and thus avoids a zero bias condition for the preamplifier stage 154. Further, the bias generator 156 changes the bias current of the preamplifier stage 154 based on a difference between the currents output by the temperature sensors 158 and 160 as shown in FIG. 3B.

Effectively, the bias generator 156 changes the bias current and the gain of the preamplifier stage 154 based on the transient temperature changes due to the self-heating of the power amplifier 152 and not based on the ambient temperature changes. Accordingly, the bias generator 156 adjusts the gain of the preamplifier stage 154 based on the transient temperature changes due to the self-heating of the power amplifier 152 and not based on the ambient temperature changes. Thus, the overall gain of the transmitter 150 (e.g., the product of the gains of the power amplifier 152 and the preamplifier stage 154) is maintained irrespective of the increase in the temperature of the power amplifier 152.

Figure 4:
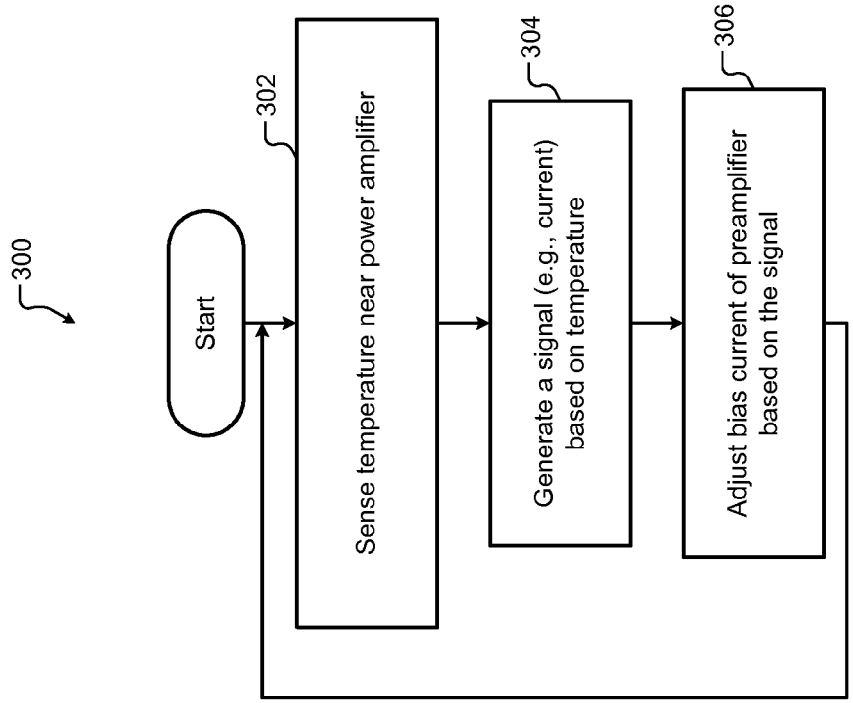

Referring now to FIG. 4, a method 300 for canceling gain changes due to self-heating of a power amplifier is shown. At 302, control senses temperature variations proximate to the power amplifier. At 304, control generates a signal (e.g., current) based on the temperature variations. At 306, control adjusts the gain of a preamplifier by adjusting bias current of the preamplifier based on the signal. Control returns to 302.

Figure 5:
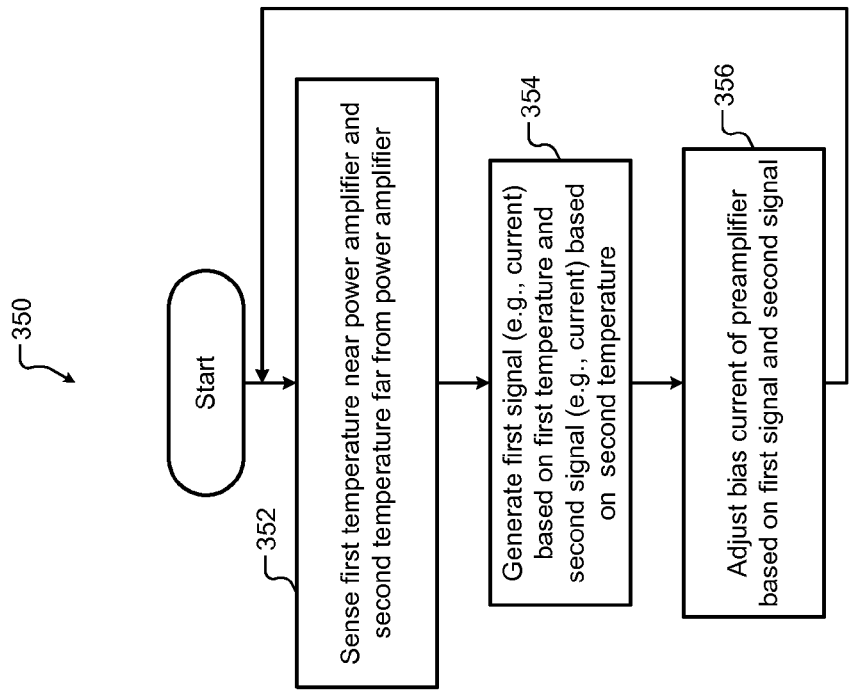
FIGS. 4 and 5 are flowcharts of methods for canceling gain changes due to self-heating of a power amplifier.

Referring now to FIG. 5, a method 350 for canceling gain changes due to self-heating of a power amplifier is shown. At 352, control senses a first temperature at a first location proximate to the power amplifier and a second temperature at a second location that is farther from the power amplifier than the first location. At 354, control generates a first signal (e.g., current) based on the first temperature and a second signal based on the second temperature. At 356, control adjusts the gain of a preamplifier by adjusting bias current of the preamplifier based on the first signal and the second signal. For example, control adjusts the bias current of the preamplifier by adding the first signal to a predetermined bias current of the preamplifier and by subtracting the second signal from the predetermined bias current of the preamplifier. Control returns to 352.

Figure 6:
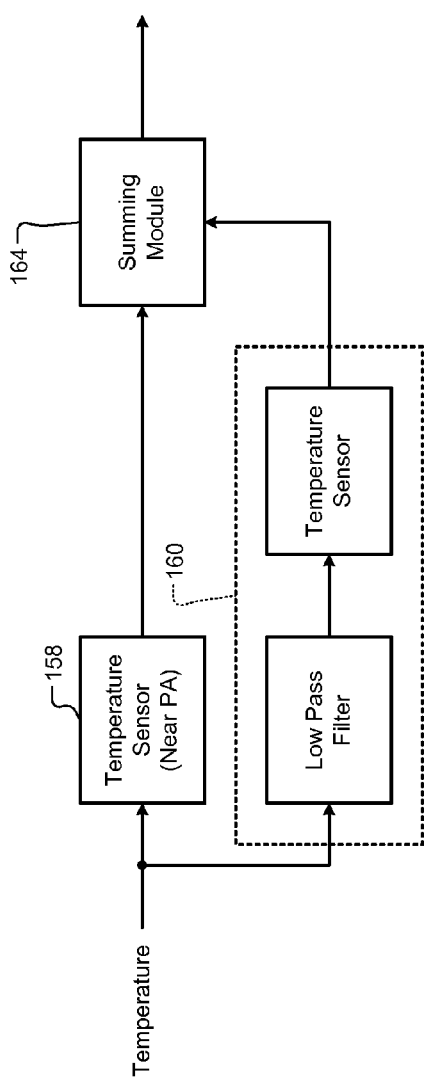
FIG. 6 depicts a schematic equivalent to the block diagrams of FIGS. 3A and 3B.

Referring now to FIG. 6, a schematic equivalent to the block diagrams of FIGS. 3A and 3B is shown. The temperature sensor 160 located far from the power amplifier 152 is equivalent to a temperature sensor and a low pass filter. The distance of the temperature sensor 160 along the die from the power amplifier 152 acts as a low pass filter. That is, the material of the die (silicon) between the power amplifier 152 and the temperature sensor 160 acts as a low pass filter. More specifically, the thermal time constant of the silicon (die) provides the function of a low pass filter.

Figure 7A:
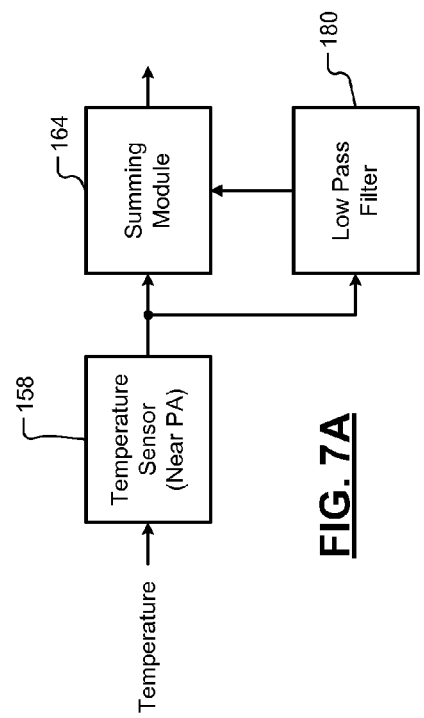
FIG. 7A is a functional block diagram of a system for canceling gain changes due to self-heating of a power amplifier using a temperature sensor and a low-pass filter.
Figure 7B:
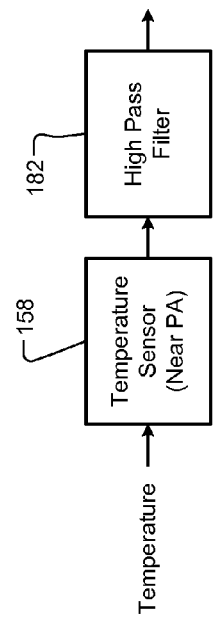
FIG. 7B is a functional block diagram of a system for canceling gain changes due to self-heating of a power amplifier using a temperature sensor and a high-pass filter.

Referring now to FIGS. 7A and 7B, instead of using two temperature sensors, a single temperature sensor and either a low pass filter circuit or a high pass filter circuit can be used to cancel gain changes due to self-heating of a power amplifier. The low pass filter circuit or the high pass filter circuit may perform digital sampling and processing on the output of the temperature sensor.

In FIG. 7A, a single temperature sensor (e.g., the temperature sensor 158) is installed adjacent to the power amplifier 152. The output of the temperature sensor 158 is input to the summing module 164. Additionally, the output of the temperature sensor 158 is input to a low pass filter circuit 180. The output of the low pass filter circuit 180 is subtracted from the output of the temperature sensor 158. The summing module 164 adds the difference to the bias current of the preamplifier stage 154 and adjusts the gain of the preamplifier stage 154. While the temperature sensor 158 in FIGS. 3A and 3B can be turned off when the power amplifier 154 is turned off, the temperature sensor 158 in FIG. 7A cannot be turned off when the power amplifier 154 is turned off.

In FIG. 7B, a single temperature sensor (e.g., the temperature sensor 158) is installed adjacent to the power amplifier 152. The output of the temperature sensor 158 is input to a high pass filter circuit 182. The output of the high pass filter circuit 182 is used to adjust the bias current and the gain of the preamplifier stage 154. While the temperature sensor 158 in FIGS. 3A and 3B can be turned off when the power amplifier 154 is turned off, the temperature sensor 158 in FIG. 7B cannot be turned off when the power amplifier 154 is turned off.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

What is claimed is:

1. A system comprising:
    a power amplifier having a first gain, wherein the first gain of the power amplifier is a function of a temperature of the power amplifier;
    a preamplifier having a second gain, wherein the preamplifier is configured to receive an input signal,
        amplify the input signal according to the second gain of the preamplifier, and
        output the amplified input signal to the power amplifier;

a first temperature sensor configured to (i) sense the temperature of the power amplifier and (ii) generate a first signal in accordance with the temperature of the power amplifier;
a second temperature sensor configured to (i) sense an ambient temperature and (ii) generate a second signal in accordance with the ambient temperature; and
a bias generator configured to
generate a biasing signal to bias the preamplifier, and
adjust the second gain of the preamplifier by (i) adding the first signal to the biasing signal, and (ii) subtracting the second signal from the biasing signal,
wherein the adjusted second gain of the preamplifier compensates a change in the first gain of the power amplifier due to a change in the temperature of the power amplifier.

2. The system of claim 1, wherein:
the first temperature sensor is located at a first distance from the power amplifier,
the second temperature sensor is located at a second distance from the power amplifier, and
the second distance is greater than the first distance.

3. An integrated circuit comprising:
a die,
wherein the die includes the system of claim 1, and
wherein the first temperature sensor is arranged on the die near the power amplifier.

4. A system comprising:
a power amplifier having a first gain;
a preamplifier having a second gain, wherein an output of the preamplifier is input to the power amplifier;
a first temperature sensor configured to sense a temperature of the power amplifier, wherein the first temperature sensor is located at a first distance from the power amplifier;
a second temperature sensor configured to sense an ambient temperature, wherein the second temperature sensor is located at a second distance from the power amplifier, and wherein the second distance is greater than the first distance; and
a bias generator configured to
generate a biasing signal, wherein the second gain of the preamplifier is based on the biasing signal, and
adjust the second gain of the preamplifier by adjusting the biasing signal based on (i) the temperature of the power amplifier and (ii) the ambient temperature.

5. The system of claim 4, wherein the adjusted second gain of the preamplifier compensates a change in the first gain of the power amplifier due to a change in the temperature of the power amplifier.

6. The system of claim 4, wherein:
the first temperature sensor is configured to generate a first signal in accordance with the temperature of the power amplifier;
the second temperature sensor is configured to generate a second signal in accordance with the ambient temperature; and
the bias generator is configured to adjust the second gain of the preamplifier by adjusting the biasing signal based on (i) the first signal and (ii) the second signal.

7. The system of claim 6, wherein the bias generator is configured to adjust the second gain of the preamplifier by (i) adding the first signal to the biasing signal, and (ii) subtracting the second signal from the biasing signal.

8. An integrated circuit comprising:
a die,
wherein the die includes the system of claim 4, and
wherein the first temperature sensor is arranged on the die near the power amplifier.

9. A method comprising:
receiving, at an input of a power amplifier, an output of a preamplifier, wherein the power amplifier has a first gain, and wherein the preamplifier has a second gain;
sensing a temperature of the power amplifier using a first temperature sensor, wherein the first temperature sensor is arranged at a first distance from the power amplifier;
sensing an ambient temperature using a second temperature sensor, wherein the second temperature sensor is arranged at a second distance from the power amplifier, and wherein the second distance is greater than the first distance; and
adjusting the second gain of the preamplifier based on (i) the temperature of the power amplifier and (ii) the ambient temperature.

10. The method of claim 9, further comprising compensating a change in the first gain of the power amplifier due to a change in the temperature of the power amplifier by adjusting the second gain of the preamplifier.

11. A method comprising:
receiving, at an input of a power amplifier, an output of a preamplifier, wherein the power amplifier has a first gain, and wherein the preamplifier has a second gain;
sensing a temperature of the power amplifier;
sensing an ambient temperature; and
generating a first signal in accordance with the temperature of the power amplifier;
generating a second signal in accordance with the ambient temperature;
generating a biasing signal, wherein the second gain of the preamplifier is based on the biasing signal; and
adjusting the second gain of the preamplifier by adjusting the biasing signal based on (i) the first signal and (ii) the second signal.

12. The method of claim 11, further comprising adjusting the second gain of the preamplifier by (i) adding the first signal to the biasing signal, and (ii) subtracting the second signal from the biasing signal.

13. The method of claim 11, further comprising compensating a change in the first gain of the power amplifier due to a change in the temperature of the power amplifier by adjusting the second gain of the preamplifier.

* * * * *